(12) United States Patent
Kikawa et al.

(10) Patent No.: US 6,990,133 B2
(45) Date of Patent: Jan. 24, 2006

(54) LASER DIODE AND MANUFACTURING METHOD THEREOF

(75) Inventors: Takeshi Kikawa, Kodaira (JP); Kouji Nakahara, Kunitachi (JP); Etsuko Nomoto, Sagamihara (JP)

(73) Assignees: Hitachi, Ltd., Tokyo (JP); Opnext Japan, Inc., Kanagawa (JP)

( * ) Notice: Subject to any disclaimer, the term of this patent is extended or adjusted under 35 U.S.C. 154(b) by 0 days.

(21) Appl. No.: 10/772,294

(22) Filed: Feb. 6, 2004

(65) Prior Publication Data
US 2005/0127383 A1 Jun. 16, 2005

(30) Foreign Application Priority Data
Dec. 10, 2003 (JP) .............................. 2003-411404

(51) Int. Cl.
*H01S 5/00* (2006.01)

(52) U.S. Cl. ................. 372/49.01; 372/43.01; 372/44.01

(58) Field of Classification Search ................. 438/22, 438/27, 29, 31, 38; 372/43–50, 99
See application file for complete search history.

(56) References Cited

U.S. PATENT DOCUMENTS 5,063,173 A    11/1991    Gasser et al.
6,795,480 B1 *  9/2004    Kaya et al. .................... 372/99

FOREIGN PATENT DOCUMENTS

JP    2002-223026    1/2001
JP    2003-86884     9/2001

OTHER PUBLICATIONS

Tonao Yuasa et al., "Facet Protection of (AlGa) As Lasers Using $SiO_2$ Sputter Deposition", Appl. Phys. Lett, vol. 34, No. 10, (May 15, 1979), pp. 685-687.

* cited by examiner

*Primary Examiner*—Nathan J. Flynn
*Assistant Examiner*—Johannes Mondt
(74) *Attorney, Agent, or Firm*—Reed Smith LLP; Stanley P. Fisher, Esq.; Juan Carlos A. Marquez, Esq.

(57) ABSTRACT

Laser diodes containing aluminum at high concentration in an active layer have been usually suffered from remarkable facet deterioration along with laser driving operation and it has been difficult for the laser diodes to attain high reliability. An aluminum oxide film lacking in oxygen is formed adjacent to the semiconductor on an optical resonator facet, by which facet deterioration can be minimized and, accordingly, the laser diode can be operated with no facet deterioration at high temperature for long time and a laser diode of high reliability can be manufactured at a reduced cost.

2 Claims, 9 Drawing Sheets

MAGNIFICATION OF A (ACTIVE LAYER) REGION

MAGNIFICATION OF A
(ACTIVE LAYER) REGION

LASER DIODE AND MANUFACTURING METHOD THEREOF

BACKGROUND OF THE INVENTION

1. Field of the Invention

The present invention relates to a semiconductor light source typically represented by a laser diode and, more in particular, it relates to a semiconductor light source suitable for use in writing light sources of optical disks or magneto-optical disks, and for use in optical communication modules, optical communication systems, and optical networks.

2. Description of the Related Art

At present, laser diodes with a high degree of reliability have been demanded for use in writing to optical disks or magneto-optical disks, as well as in optical communication systems. Such laser diodes are required to operate for a long time, stably in a basic mode. A coating film made of an insulator film is applied to the surface of a semiconductor forming a light emission surface of semiconductor laser diodes. This is used to improve the light outputting efficiency by obtaining an appropriate reflectivity and to prevent lowering of a maximum output due to the increase in a threshold carrier density. For the coating film, a thin silicon oxide film is used as a low reflection film on one side, and a multi-layered film comprising a thin silicon oxide film and a thin hydrogenated amorphous silicon film as a high reflection film formed on the other side of an optical resonator. It is reported, for example, by T. Yuasa, et al. Applied Physics Letters, vol. 34, pp 685.

Further, a vacuum-through process of conducting formation of a facet and formation of a facet protection film by cleave through a super-high vacuum has been intended to suppress light absorption caused by oxidation of a facet of an optical resonator. In U.S. Pat. No. 5,063,173, for example, a facet of an optical resonator is formed by cleaving a laser diode wafer in a super-high vacuum, and then directly depositing a thin film comprising Si, thereby forming an oxide film on a semiconductor surface in the facet of an optical resonator.

In a case of using aluminum oxide for the facet protection film, since defects, if any, caused by lack of oxygen in an aluminum oxide film results in a problem in view of the resistance to damp of the film, Japanese Patent Laid-open No. 2003-86864 discloses that a resistance to damp can be improved by depositing molecules of water to the surface of aluminum oxide to compensate the defects. Further, Japanese Patent Laid-open No. 2002-223026 discloses that the reliability of the laser diode can be improved by lowering the internal stress of the facet coating film of the laser device.

It is necessary for the laser diode with a high degree of reliability to suppress facet deterioration caused by the laser driving operation. The facet deterioration is caused by repeating of mechanisms as follows: the facet temperature is elevated by absorption of a portion of light oscillated by laser driving operation to the non-radiative recombination center at the facet, and the non-radiative recombination center is thereby multiplied to further raise the facet temperature. Most of the non-radiative recombination centers are formed by the trap level in the forbidden band formed by diffusion of oxygen in the semiconductor. Accordingly, to minimize the facet deterioration, it is essential to minimize diffusion of oxygen to the semiconductor facet.

The facet deterioration is remarkable in the laser diode of a structure containing aluminum in an active layer. The unique study of the present inventors has found that in a case where aluminum is contained in an active layer, when an amorphous silicon film or micro-crystal silicon film is formed adjacent to the semiconductor, bending of a band in which the band of the semiconductor is in an electron accumulation state is caused near the boundary, and the leak current near the boundary increases to promote the deterioration even when there is no oxygen diffusion.

Further, in a case where a silicon oxide film or a silicon nitride film is deposited adjacent to the semiconductor facet, since aluminum in the semiconductor tends to be bonded with oxygen more easily than with silicon, oxygen in the film diffuses into the semiconductor causing bonding with aluminum to promote deterioration. Also in a case of using the silicon nitride film, since a small amount of oxygen contained in the film is bonded preferentially with aluminum, no suppression effect can be obtained.

Also in a device not incorporating aluminum, arsenic in the semiconductor is bonded with oxygen to form a trap level, which causes similar deterioration.

Further, a reflection film formed to the facet often has a multi-layered structure so as to obtain a desired reflectivity. Even when the internal stress in each of the layers is small, the total stress on the semiconductor increases because of the multi-layered structure. Accordingly, since the amount of strain caused in the semiconductor crystals is increased, oxygen tends to diffuse to the boundary making it difficult to minimize deterioration on the facet.

SUMMARY OF THE INVENTION

An object of the present invention to provide a device structure for attaining a highly reliable laser diode by minimizing deterioration of the laser diode caused by diffusion of oxygen accompanying the laser driving operation, as well as a method of manufacturing the same.

The foregoing object can be attained, for example, by forming aluminum oxide 102 lacking in oxygen in close vicinity to a semiconductor on an optical resonator facet 101 of a laser diode, for example, as shown in FIG. 1. To adjust the reflectivity, optical thin films 106, 107 at least containing one or more layers of insulator films having a refractive index different from aluminum oxide may be layered on the aluminum oxide 102. For the optical thin films 106, 107 insulator films having a refractive index of 1.9 or more can be used as a high refractive index film, such as an amorphous silicon film, silicon nitride film, titanium oxide film, tantalum oxide film, hafnium oxide film, or aluminum nitride film. Further, for the low refractive index film, those films having a refractive index of 1.7 or less may be used, such as a silicon oxide film, magnesium fluoride film, or cerium fluoride film in addition to the aluminum oxide film. However, since the nitride film such as a silicon nitride film has a large internal stress, it may cause undesired effects on the reliability due to the increase of the total stress of the reflective films, and a care is necessary for the use thereof.

Various studies have been found that in a case where lacking in oxygen composition of aluminum oxide is 10% or less of the stoichiometric composition, that is, in a case of: $Al_2O_{3-x}$ ($X \leq 0.3$) in the chemical formula, lowering of resistance to damp caused by oxygen defects in the film, an increase in the absorption of light and an increase of the number of surface states caused at the interface of semiconductor and aluminum oxide due to defects are each at a negligible level, and cause no undesired effects on the device characteristics. FIG. 11 shows occurrence of film peeling-off after keeping for 300 hours under the conditions of a temperature of 85° C. and a humidity of 85%. As apparent from the graph, film peeling-off did not occur in a case where $X \leq 0.3$. FIG. 12 shows the dependence of an extinction coefficient of an aluminum oxide film on the oxygen concentration. The extinction coefficient shows the extent of light absorption, and the light absorption did not occur in a case where $X \leq 0.2$, and light absorption caused no practical problem even at X=0.3. FIG. 13 shows the dependence of critical load on the oxygen concentration in a scratch test. The critical load is a load at which film peeling-off starts in the scratch test, which is an index for adhesion. It was found that, in an aluminum oxide film with no oxygen defects, the film was scarcely adhered and highly liable to be peeled off. The adhesion is improved in the loss of oxygen state and it can be seen that adhesion is improved in the loss of oxygen state, and a preferred film has the highest adhesion at X=0.2. The adhesion is rather lowered when the loss of oxygen component increases more. In view of experience, there is no practical problem in a case where the critical load is 30 mN or more. FIG. 14 shows a surface state density at an interface of InP and aluminum oxide film obtained by measurement for characteristics of high frequency capacitance/voltage characteristics. At X=0.2 or less, the surface states density is less than the detectable limit and the amount thereof is slight also at X=0.3. As described above, it has been found that favorable characteristics with no practical problems at all are shown at $X \leq 0.3$ as described above. In particular, in a case where $Al_2O_{3-x}$ ($X \leq 0.2$), each of lowering in the resistance to damp, increase in the light absorption and increase of the surface states density is less than the detectable limit and it is extremely satisfactory. Further, for the spontaneous oxide film formed at the facet by contact with atmospheric air after the formation of the facet by cleavage or the like, oxygen is absorbed in aluminum oxide by the formation of aluminum oxide in the state of lacking in oxygen, to obtain a clean interface of semiconductor and aluminum oxide. It is probably that this improved adhesion between the reflection film and the semiconductor as shown in FIG. 13.

Since diffusion of oxygen to the semiconductor can be suppressed and bonding of semiconductor-constituting elements, particularly, aluminum and arsenic with oxygen can be prevented by forming the state of lacking in oxygen, facet deterioration can be minimized. FIG. 15 shows a result of conducting an automatic power controlled operation test at a temperature of 85° C. and then allowing an operation current to flow till the laser diode emits the maximum optical power and examining whether catastrophic optical damages (COD) are caused or not. The catastrophic optical damages were not caused in $X \geq 0.03$ (as shown by symbols "○" in FIG. 15, catastrophic optical damage was not caused in the continuous operation test till 5000 hours). FIG. 16 shows a result of conducting an automatic power controlled operation test for 100 hours, then applying a pulsative DC voltage and examining a voltage causing electrostatic destroy deterioration. The electrostatic destroy deterioration was no more caused in $X \geq 0.03$ and at 500 V or lower and, particularly, deterioration was no more caused upon application of a voltage even at 1000 V in $X \geq 0.1$ (symbol "○" shown in FIG. 16). As described above in a case where loss of oxygen of at least 1% or more relative to the stoichiometric composition is present, that is, at $Al_2O_{3-x}$ ($0.03 \leq X$), the effects for minimizing catastrophic optical damages (COD) deterioration and deterioration of electrostatic breakdown voltage is remarkable. In particular, in a case where $Al_2O_{3-x}$ ($0.1 \leq X$), the effect of minimizing catastrophic optical damages (COD) deterioration and deterioration of electrostatic destroyed minimum voltage is most favorable, and the effect tends to be saturated.

The total stress in the multi-layered film is defined as the sum of the product of the film thickness and the internal stress of each of the layers. As the total stress increases, the amount of strain caused in the semiconductor crystals increases. In this case, light elements of small ionic diameter tend to gather at the interface of the semiconductor and the insulator film so as to moderate the strain. That is, oxygen tends to gather at the interface of the semiconductor and the insulator film to promote deterioration. FIG. 17 shows the ratio of the maximum optical power after an automatic power controlled continuous operation test for 3000 hours to the maximum initial optical power. It can be seen that the ratio of the lowering of the maximum power increases as the total stress increases. In particular, in a case where the total stress is 150 Pa·m or less, the maximum optical power is restricted by heat saturation and no catastrophic optical damage was caused. On other hand, at 200 Pa·m or more, the catastrophic optical damage was caused. FIG. 18 shows the result of an electrostatic destroy test after an automatic power controlled continuous operation test for 100 hours. The electrostatic destroyed minimum voltage was excellent in a case where the total stress of the reflection film was 150 Pa·m or less and, particularly, the electrostatic destroyed minimum voltage was not formed at 100 Pa·m or less (symbol "○" shown in FIG. 18). As described above, to minimize the deterioration promotion due to strain, it is necessary to restrict the total stress of the reflection films 104, 105 shown in FIG. 1 to 150 Pa·m or less. Promotion of the deterioration was no more caused at 100 Pa·m or less. To decrease the total stress, it is necessary to lower the internal stress in each of the layers. A nitride film such as a silicon nitride film should not be used as the high refractive index film. Since the film thickness is also reduced by the use of an amorphous silicon film having a high refractive index and with relatively small internal stress, the total stress can be increased. In a case where it is difficult to use the amorphous silicon film, a titanium oxide film may also be used. An aluminum oxide film, silicon oxide film or magnesium fluoride can be used as the low refractive index film. In the sputtering using a rare gas element such as argon, intrusion of the rare gas element into the film may sometimes give an effect on the internal stress. In order to decrease the internal stress of the aluminum oxide film, it is necessary to lower the amount of the rare gas element in the film as less as possible; the internal stress can be controlled to 150 MPa or less by controlling the rare gas to 1 at % or less. For the silicon oxide film, higher intrusion of the rare gas element is more desirable; the stress could be controlled to 200 Mpa or less at 3 at % or more. The total stress can be decreased to 150 Pa·m or less in a reflection preventive film at a reflectivity of 0.1% or less, a low reflection film at a reflectivity of 10% or less, or a high reflection film at a reflectivity of 40%, 70% and 90% by designing the structure of the reflection films such that the internal stress of the film at low reflective index is decreased and the number of layers is small and the film thickness is reduced. In particular, in the reflection film at a reflectivity of 40% or less, it is easy to control the total stress to 100 Pa·m.

According to the invention, a native oxide film on the semiconductor facet can be removed and the diffusion of oxygen into the semiconductor can be minimized by forming an aluminum oxide film lacking in oxygen of $Al_2O_{3-x}$ ($0.03 \leq X \leq 0.3$) adjacently to the semiconductor. This can minimize deterioration caused by the laser diode driving operation and higher reliability of the laser diode can be attained by the easy method. This can improve the yield and attain the reduction of cost.

BRIEF DESCRIPTION OF THE DRAWINGS

Preferred embodiments of the present invention will be described in details based on the drawings in which.

DESCRIPTION OF THE PREFERRED EMBODIMENTS

Examples of the present invention will be explained with reference to the drawings.

EXAMPLE 1

Figure 1:
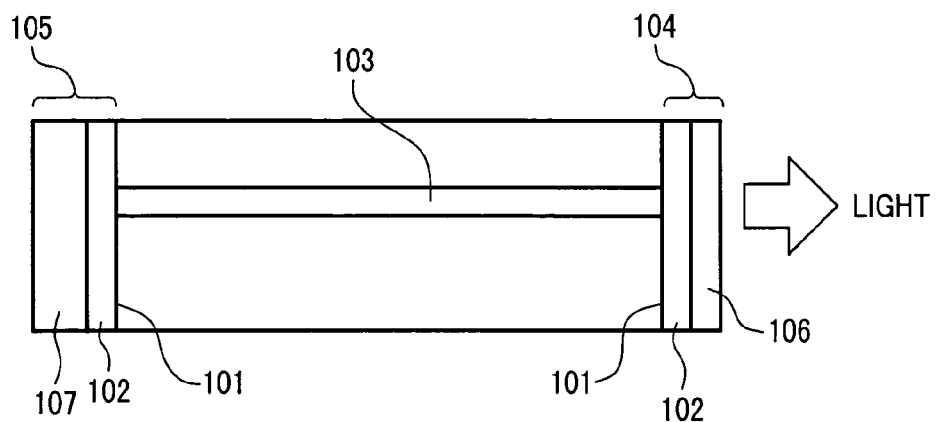
FIG. 1 is a view explanating the constitution of the invention by using a laser diode.
Figure 2A:
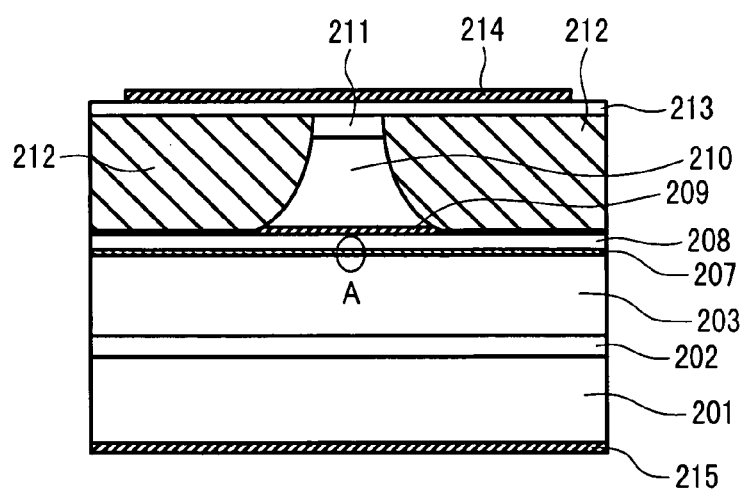
FIGS. 2A and 2B are views showing a transversal cross-sectional structure of a laser diode according to Example 1 of the invention.
Figure 2B:
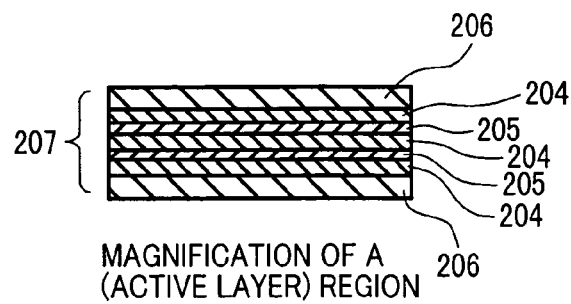
Figure 3:
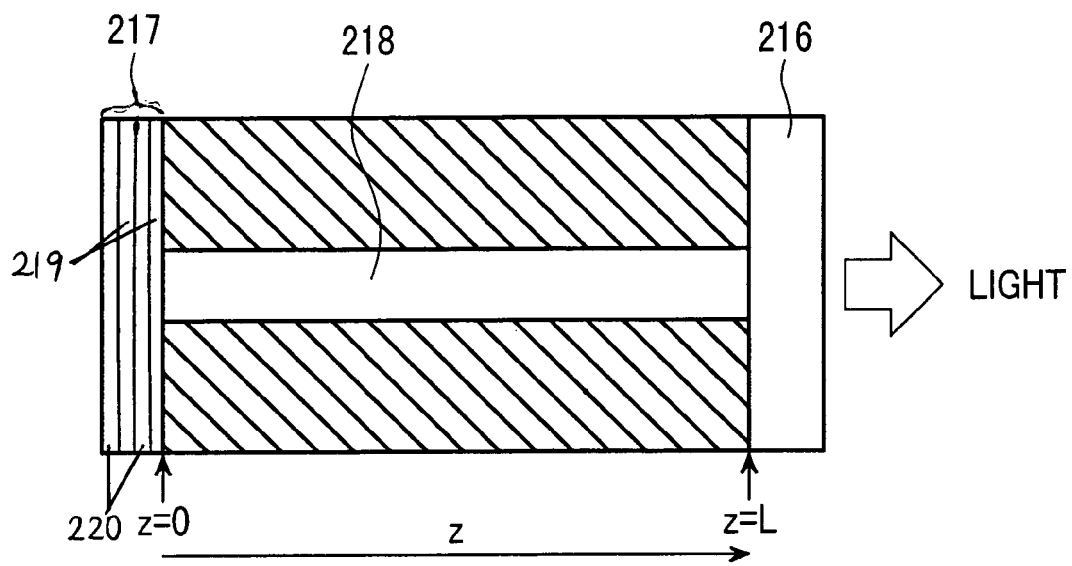
FIG. 3 is a view showing a planer structure of a laser diode according to Example 1 of the invention.

A first example of the invention is to be explained with reference to FIGS. 2A, 2B and 3. This example is applied to a high power laser diode for 0.65 µm band used for writing in optical disks or magneto-optical disks. FIG. 2A shows a cross-sectional structure, FIG. 2B is an enlarged view of an active layer, and FIG. 3 shows planer structure. Then a device manufacturing method is to be described. On an n-typed GaAs substrate 201, are formed successively, a GaAs buffer layer 202, an n-typed $(Al_xGa_{1-x})InP$ clad layer 203 lattice matched to GaAs (x=0.7), a strained quantum well active layer 207 comprising $(Al_yGa_{1-y})InP$ barrier layers (y=0.45, barrier layer thickness 4 nm) 204 lattice matched to GaAs, $In_zGa_{1-z}P$ strained quantum well layers (z ~0.58, well layer thickness 87 nm) 205, and $(Al_sGa_{1-s})Inp$ SCH (Separate Confinement Heterostructure) layers (s=0.55, barrier wall layer thickness 4 nm) 206, a p-typed $(Al_tGa_{1-t})InP$ clad layer (t=0.7) 208 lattice matched to GaAs, a p-typed InGaP etching stopping layer 209 lattice matched to GaAs, and a p-typed $(Al_uGa_{1-u})InP$ clad layer (u=0.7) 210 and a p-typed $Al_vGa_{1-v}As$ cap layer (v=0.7) 211 by an MOVPE method, a CBE method or a MBE method. Then, a ridge as shown in FIG. 2A is formed by photo-etching step using an oxide film as a mask. Etching in this step may be applied by any method such as a wet, RIE, RIBE, or ion milling method. Etching is stopped at the p-InGaP etching stopping layer 209 so that it does not reach the strained quantum well active layer 207. Then, an n-typed GaAs current blocking layer 212 is grown selectively by an MOVPE method as shown in FIG. 2A using the oxide film that was used as an etching mask as a selective growing mask. Then, a wafer is taken out of a growing furnace, and the oxide film used as the selective growing mask is removed by etching. Thereafter, a p-typed GaAs contact layer 213 is formed by an MOVPE method or MBE method. After forming an ohmic contact electrode 214 on p-typed GaAs, and an ohmic contact electrode 215 on n-typed GaAs, a laser diode having an optical resonator length of about 600 µm is obtained by a cleaving method. Then, as shown in FIG. 3, by using a helicon wave plasma excited reactive vapor deposition method, an aluminum oxide $(Al_2O_{2.9})$ film lacking 3.3% oxygen with a thickness of λ/4 (λ: oscillation wavelength) is formed thereby forming a low reflection film 216 on the forward facet (z=1) of the device. In addition, a high reflection film 217 comprising an aluminum oxide $(Al_2O_{2.85})$ film lacking 5% oxygen and a 3-periodical titanium oxide film 220 formed on the backward facet (Z=0) of the device. Additional facet protection films or facet reflection films having an aluminum oxide film lacking oxygen may be added on the backward facet of the device. Aluminum oxide is deposited by using a reactive sputtering method or ion beam sputtering method. In this step, deposition is conducted by irradiating a metal aluminum target with plasma or ion beams by using a gas mixture of an argon gas and an oxygen gas.

Subsequently, the device is bonded with the junction face being upside on a heat sink. The trially manufactured device oscillated continuously at room temperature with a threshold current of about 14 mA, and the oscillation wavelength was about 0.65 µm. Further, the device oscillated stably in a single transverse mode as far as 150 mW. Further, an optical power of 400 mW or more is obtained as a maximum optical power. Further, when 30 devices were put to automatic optical power controlled continuous operation at 150 mW under the condition of a circumstantial temperature of 80° C., the initial operation current was about 300 mA and all the devices operated stably for 50,000 hours or more.

While a helicon wave plasma excited reactive vapor deposition is used as a protection film forming method in this example, other thin film forming method, for example, a chemical vapor deposition (CVD) method, an electron beam (EB) vapor deposition method, an ion beam (IB) vapor deposition method or a sputtering method may also be used.

EXAMPLE 2

Figure 4:
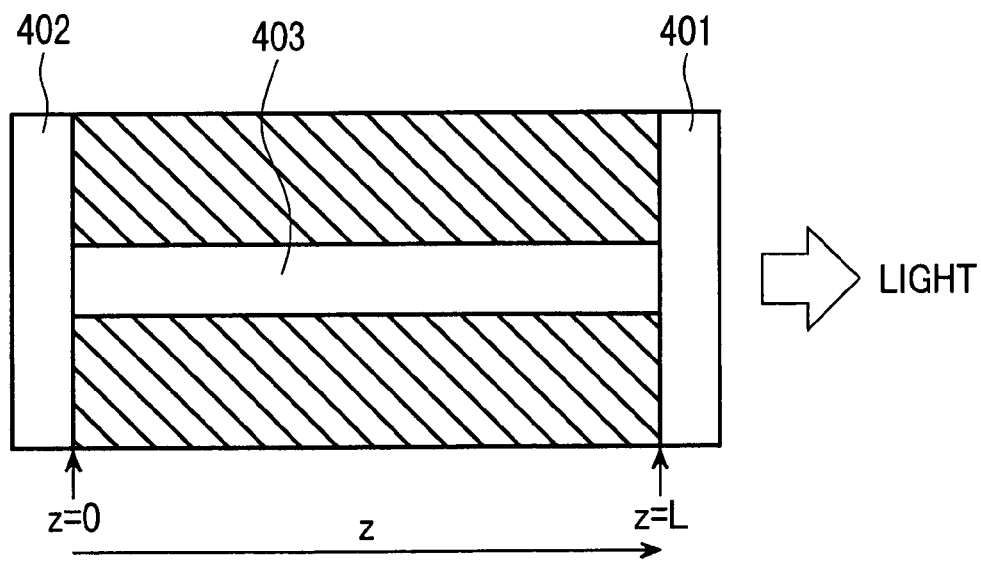
FIG. 4 is a view showing a planer structure of a laser diode according to Example 2 of the invention.
Figure 5A:
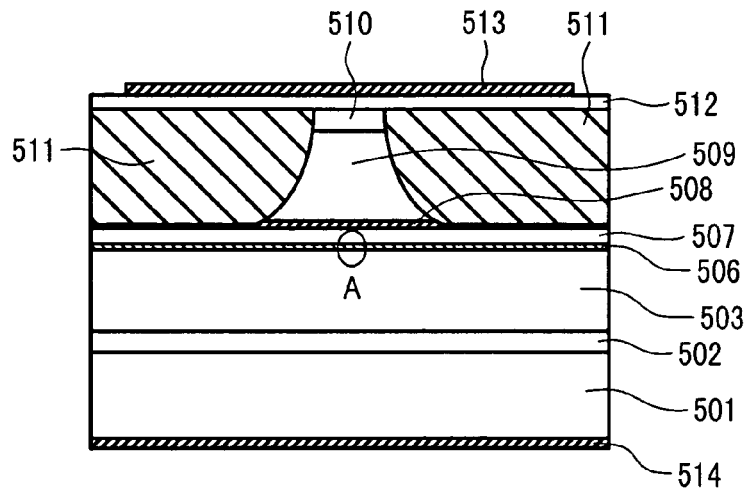
FIGS. 5A and 5B are views showing a transversal cross-sectional structure of a laser diode according to Example 2 of the invention.
Figure 5B:
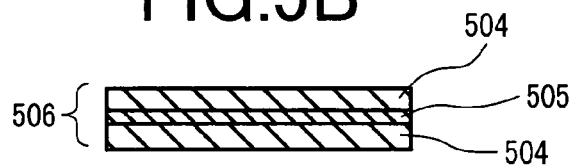

A second example of the invention is to be described with reference to FIGS. 4, 5A and 5B. In this example, the invention is applied to a high power laser diode for 0.98 μm band for a rare earth-doped optical fiber amplifier excitation for use in relays or receivers in optical transmitting systems. FIG. 4 shows a planar structure of a laser diode having a Fabry-Pelot type optical resonator, FIG. 5A shows a cross-sectional structure of the same and FIG. 5B shows an enlarged view of an active layer. Then, a device manufacturing method is to be described. On an n-typed GaAs substrate 501, are formed successively, a GaAs buffer layer 502, an n-typed InGaP clad layer 503 latticed matched to GaAs, a strained quantum well active layer 506 comprising $In_{1-x}Ga_xAs_yP_{1-y}$ barrier layers (x=0.82, y=0.63, a barrier layer thickness 35 nm) 504 lattice matched to GaAs, and an $In_xGa_{1-z}As$ strained quantum well layer (z 0.16, well layer thickness 7 mm) 505, a p-typed InGaP clad layer 507 lattice matched to the GaAs substrate, a p-typed GaAs optical waveguide layer 508, a p-typed InGaP clad layer 509 latticed matched to GaAs, and a p-typed GaAs cap layer 510 by an MOVPE method, a gas source MBE method or a CBE method successively. Then, a ridge as shown in FIG. 5A is formed by a photo-etching step using an oxide film as a mask. Etching may be applied in this step by any method such as a wet, RIE, RIBE, or ion milling method. Etching is stopped at the midway of the p-typed InGaP clad layer 507 such that it completely removes the p-typed GaAs optical waveguide layer 508 but does not reach the strained quantum well active layer 506. Then, an n-typed InGaP current blocking layer 511 is grown selectively by an MOVPE method as shown in FIG. 5A using the oxide film that was used as the etching mask as a mask for selective growing. Then, a wafer is taken out of a growing furnace, and the oxide film used as the selective growing mask is removed by etching. Then, a p-typed GaAs contact layer 512 is formed by an MOVPE method or MBE method. After forming an ohmic contact electrode 513 on p-typed GaAs and an ohmic contact electrode 514 on p-typed GaAs, a laser diode of an optical resonator length of about 900 μm is obtained by a cleaving method. Then, a low reflection film 401 comprising aluminum oxide ($Al_2O_{2.85}$) lacking 5% oxygen with a thickness of λ/4 (λ: oscillation wavelength) is formed on the forward facet (z=L) of the device and a high reflection film 402 of 6-layered film comprising an aluminum oxide ($Al_2O_{20.85}$) film lacking 6.7% oxygen and an amorphous silicon (a-Si) thin film is formed on the backward facet (z=0) of the device by a sputtering method. Then, the device is bonded with the junction face being upside on a heat sink. The trially manufactured device oscillated continuously at room temperature with a threshold current of about 10 mA, and the oscillation wavelength thereof was about 0.98 μm. Further, the device oscillated stably in a single transverse mode as far as 700 mW. The facet deterioration was not caused even when the optical power was increased, and the maximum optical power 800 mW is restricted by heat saturation. Further, when 30 devices were put to automatic optical power controlled continuous operation at 500 mW under the condition of a circumstantial temperature of 80° C., the initial operation current was about 400 mA and all the devices operated stably for 100,000 hours or more.

While the sputtering method was used as a protection film forming method in this example, other thin film forming method, e.g., a CVD method, an EB vapor deposition method, an IB vapor deposition method, or a helicon wave plasma excited reactive vapor deposition method may also be used.

EXAMPLE 3

Figure 6:
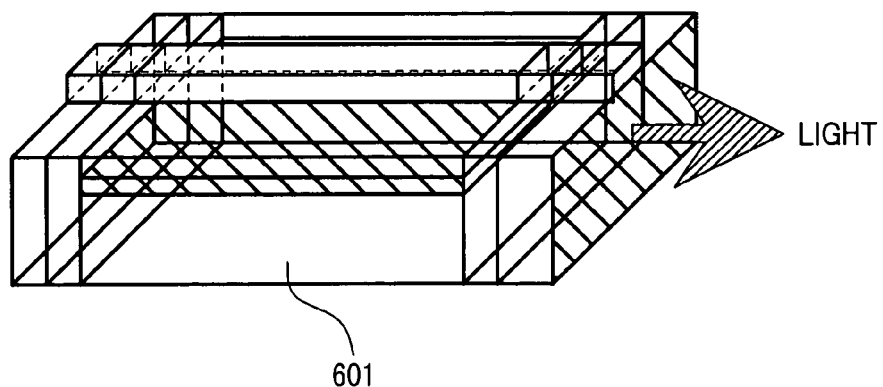
FIG. 6 is a view showing a perspective structure of a laser diode according to Example 3 of the invention.
Figure 7:
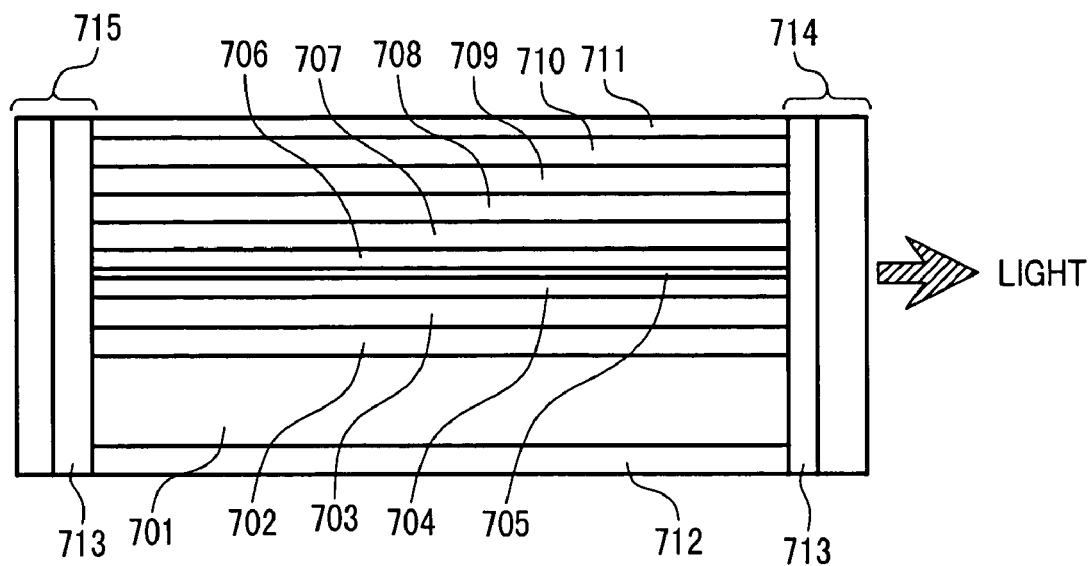
FIG. 7 is a view showing a longitudinal cross-sectional structure of a laser diode according to Example 3 of the invention.

A third example applying the invention is to be explained with reference to FIGS. 6 and 7. In this example, the invention is applied to a laser diode for 1.3 μm band used as a light source in subscriber's optical transmission systems. FIG. 6 is a perspective structure of a laser diode and FIG. 7 shows a cross sectional structure. Then, a device manufacturing method is to be described. After growing an n-typed InP buffer layer 702 on an n-typed InP substrate 601, 701, an n-typed InAlAs clad layer 703 lattice matched to InP, an n-typed InGaAlAs lower SCH layer 704, a strained quantum well active layer 705 comprising an InGaAlAs strained barrier layer (band gap: 1.32 eV, barrier layer thickness: 8 nm) and an InGaAlAs strained quantum well layer. (band gap: 0.87 eV, well layer thickness: 6 nm), a p-typed InGaAlAs upper SCH layer 706 lattice matched to the InP substrate, a p-typed InAlAs first clad layer 707, a p-typed InP second clad layer 708, a p-typed InGaAs cap layer 709, and a p-typed InGaAs contact layer 710 are formed successively by an MOVPE method, a gas source MBE method or a CBE method. Then, a ridge as shown in FIG. 2 is formed by a photoetching step using an insulator film or the like as a mask. Etching may be conducted in this step by any method such as a wet, RIE, RIBE or ion milling method. Etching is stopped at the midway of the p-typed InP second clad layer 708 such that it does not reach the strained quantum well active layer 705. Then, regions other than the surface of the p-typed InGaAs contact layer 710 is covered with a silicon oxide film (not illustrated) formed by a plasma CVD method. Titanium of 100 nm thickness, platinum of 100 nm thickness and gold of 600 nm thickness are successively vapor deposited thereon as the ohmic electrode 711 for p-typed InGaAs, and fabricated to leave a ridge upper surface and wiring pads (not illustrated). Then, after polishing the lower surface of the n-typed InP substrate 701 to reduce the thickness to 120 μm, gold-germanium, nickel, and gold are vapor deposited to form an ohmic electrode 712 for n-typed InP. The laser diode wafer is cleaved to form a pair of laser resonator facets. Then, a facet protection film 713 comprising an aluminum oxide ($Al_2O_{2.85}$) film lacking 5% oxygen is formed to both of forward and backward facets by using a sputtering method and, further thereon, reflection films 714, 715 comprising amorphous silicon film, silicon oxide film, aluminum oxide film, etc. are formed and adjusted such that the reflectivity on the facets are 40% and 75%. The laser diode device 601 is connected to a silicon sub-mount with a soldering material by a junction up method and the device electrodes and package electrode leads are connected by gold wires (not illustrated). For forming aluminum oxide, a gas mixture of argon and oxygen was introduced using metal aluminum as a target to form plasmas, and aluminum and oxygen sputtered from the target surface are reacted to form oxide films. The composition of the aluminum oxide film can be controlled by controlling the oxygen partial pressure. In this example, an aluminum oxide $Al_2O_{2.85}$ is obtained by controlling the argon flow rate to 40 sccm and the oxygen flow rate to 8 sccm. The total stress in the forward reflection film 714 is 50 Pa·m and the total stress in the backward reflection film 715 is 90 Pa·m. The prototyped device oscillates continuously at a room temperature with a threshold current of about 6 mA, and the oscillation wavelength thereof is about 1.3 μm. Further, the device oscillates stably in a single transverse mode up to maximum optical power of 80 mW. Further, the facet deterioration is not caused even when the optical power is increased, and the maximum optical power 80 mW is restricted by heat saturation. Further, when 30 devices are put to automatic power controlled continuous operation at 15 mW under the conditions at a circumstantial temperature of 80° C., all the devices operate stably without facet deterioration for 10,000 hours or more.

Since the invention is not restricted to any waveguide structure, a BH (Buried Heterostructure) structure may also be used as the waveguide structure in addition to the example described above. It may be a distributed feedback laser diode structure having a diffraction grating along the active layer. Further it may be an integrated optical source in which optical modulators or wavelength conversion devices are integrated adjacent to the resonator. Needless to say, it may be applied to laser diodes for 0.98 μm, 1.48 μm, and 1.55 μm band or a red laser diode for 0.6 μm band in addition to the 1.3 μm band as described above. As a high refractive index film for use in the reflection film, it is preferred to use materials having a refractive index of 1.9 or more such as an amorphous silicon film, titanium oxide film, tantalum oxide film or hafnium oxide film. As the low refractive index film, it is preferred to use materials having a refractive index of 1.7 or less such as silicon dioxide film, aluminum oxide film or magnesium fluoride film. While the sputtering is used for depositing the facet protection film and the reflection film, any of various methods may be used such as glow discharge sputtering method, high frequency sputtering method, electron cyclotron resonance sputtering method or ion beam sputtering method. Further, other thin film forming method, for example, a CVD method, an EB vapor deposition method, an IB vapor deposition method, or a helicon wave plasma excited reactive vapor deposition method may also be used.

EXAMPLE 4

Figure 8:
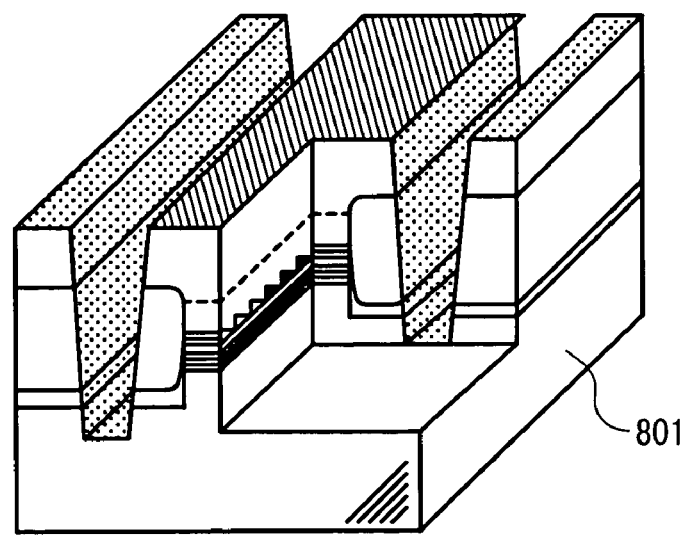
FIG. 8 is a view showing a structure of a laser diode according to Example 4 of the invention.

FIG. 8 shows an example of manufacturing a distributed feedback laser diode for 1.3 μm wavelength band having another structure by using the invention. This is different from Example 3 mainly in using a p-typed substrate 801 and adopting a buried heterostructure. Injection efficiency of holes to the active layer is improved more by using the p-typed substrate 801 compared with the device of Example 3.

Figure 9:
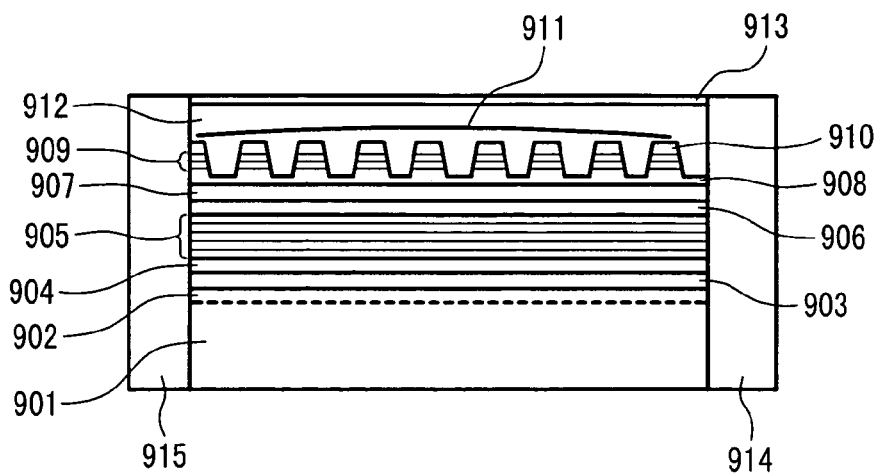
FIG. 9 is a view showing a vertical cross-sectional structure of a laser diode according to Example 4 of the invention.

As shown in FIG. 9, on a p-typed (100) InP semiconductor substrate 901, are successively formed by an organo metal gas phase growing method, a p-typed InP buffer layer 902 of 1.5 μm, a p-typed InAlAs buffer layer 903 of 0.1 μm, an undoped InGaAlAs lower graded guide layer 904 of 0.1 μm, an undoped 7-period InGaAlAs multi-quantum well layer (1.2% compression strain InGaAlAs (compositional wavelength 1.37 μm) well layer of 5 nm thickness, and InGaAlAs (compositional wavelength: 1.00 μm) barrier layer of 8 nm thickness) 905, an undoped InGaAlAs middle guide layer 906 of 0.1 μm, an undoped InGaAlAsP graded composition layer 907, an undoped InGaAsP (compositional wavelength: 1.05 μm) middle guide layer 908 of 0.05 μm, an undoped 3-period InGaAsP multi-quantum well layer (1.0% compression strain InGaAsP (compositional wavelength: 1.37 μm) of 5 nm thickness) well layer, InGaAsP (compositional wavelength 1.00 μm) barrier layer of 8 nm thickness) 909, and an n-typed InP first clad layer 910 of 0.01 μm. The emission wavelengths of both of the multi-quantum well active layers 905 and 903 are about 1.31 μm. In this embodiment, since the p-typed substrate is used, it has a band structure capable of preventing electron supply and leakage of the electrons to the p-typed layer. Further, by the introduction of the graded composition layer 907, barrier to the electrons from the InGaAsP quantum active layer 909 to the InGaAlAs quantum well active layer 905 is decreased.

Then, the InGaAsP quantum well active layer 909 and the n-typed InP first clad layer 910 are partially removed by etching periodically as shown in FIG. 5 by photolithography using usual holographic lithography and by dry etching to form a diffraction grating 911 over the entire surface of the substrate. The period of the diffraction grating 911 is 201 nm. The depth of the diffraction grating 911 is about 50 nm, so that the diffraction grating 911 passes through the InGaAsP multi-quantum well layer 909 to reach the InGaAs middle guide layer 908. Successively, after removing the damage layer by several nm at the etching surface formed spontaneously by dry etching by a known wet etching, an undoped InP second clad layer 912 of 0.4 μm and an n-typed InGaAsP (compositional wavelength 1.3 μm) cap layer 913 of 0.1 μm were grown successively. By the steps described, a basic structure of a gain coupled distributed feedback laser diode formed with the InGaAsP type gain diffraction grating 911 above the InGaAlAs multi-quantum well layer 905 is manufactured. The normalized optical coupling coefficient of this laser diode is about 4.0.

Successively, the wafer was fabricated into a known buried heterostructure laser diode to complete the laser diode chip shown in FIG. 8. The resonator length is 200 μm. After forming a facet protection film comprising an aluminum oxide ($Al_2O_{2.8}$) film lacking 6.7% oxygen to the forward facet and backward facet by using a sputtering method, reflection films 914, 915 each comprising an amorphous silicon film and an aluminum oxide film are formed such that the reflectivity at the facets are 0.1% and 70%, respectively.

The thus manufactured distributed feedback laser diode for 1.3 μm band has a threshold current of 3 mA and an oscillation efficiency of 0.35 W/A under a room temperature and continuous conditions. Further, in terms of the simple and convenient manufacture, favorable oscillation characteristics of a threshold current of 9 mA and an oscillation efficiency of 0.25 W/A are obtained also at a high temperature of 85° C. When a continuous operation test is conducted at 10 mW for 10,000 hours at a high temperature of 85° C., it has been found that no facet deterioration is caused. As described above, according to the invention, the reliability of existent InGaAlAs laser diodes can be improved. This structure is applicable to distributed feedback laser diodes not only for 1.3 μm band but also for other wavelength bands. It will be apparent that the invention is applicable not only to a single device laser diode but also to a function integrated type integrated optical devices. While sputtering has been used for the deposition of the facet protection film and the reflection film, any of the methods can be used such as glow discharge sputtering, high frequency sputtering, electron cyclotron resonation sputtering or ion beam sputtering. Further, other thin film forming methods, for example, a CVD method, an EB vapor deposition method, an IB vapor deposition method or a helicon wave plasma excited reactive vapor deposition method may also be used.

EXAMPLE 5

Figure 10:
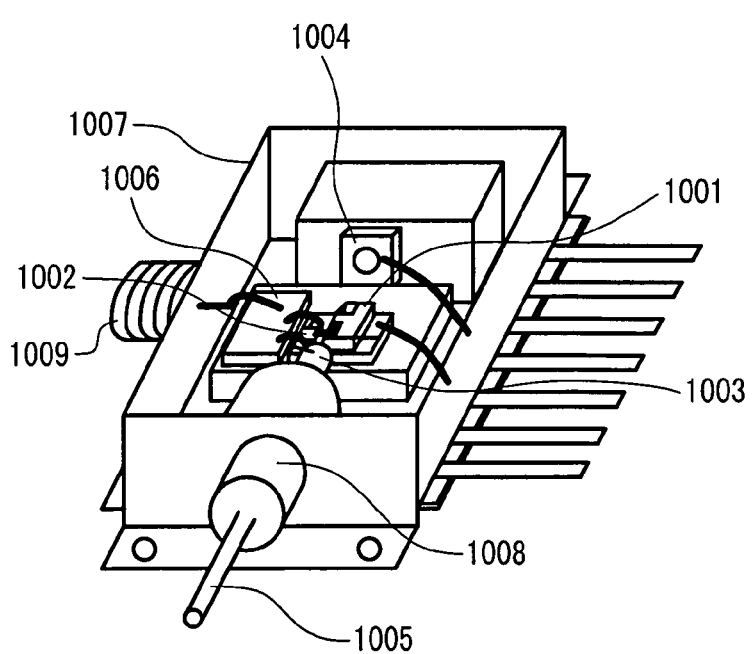
FIG. 10 is a perspective view showing the structure of a module mounted with a laser diode according to Example 3 or 4 of the invention.
Figure 11:
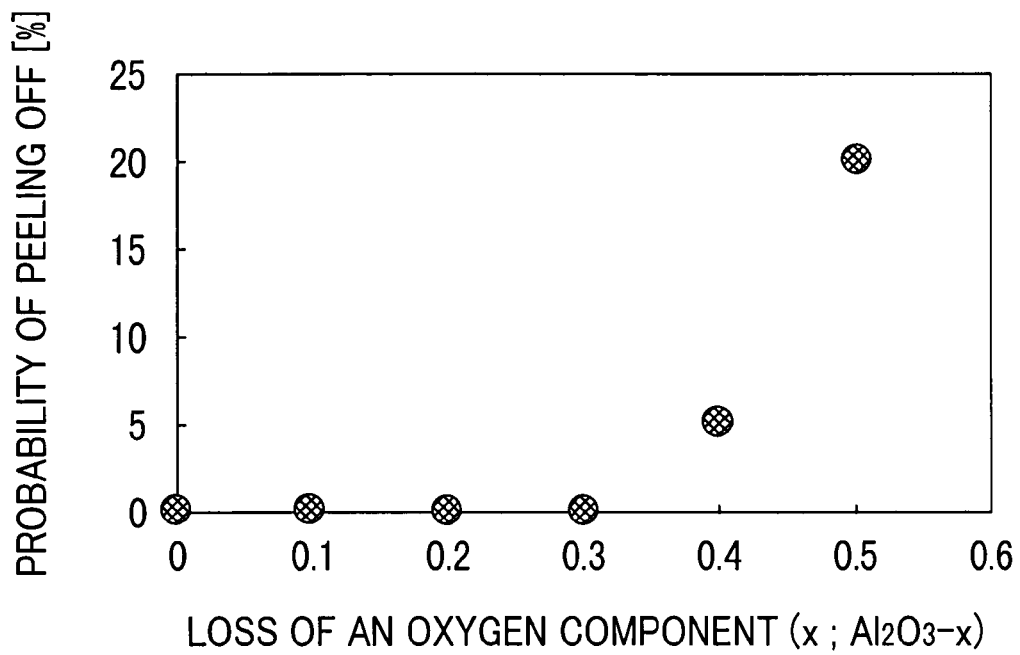
FIG. 11 is a view showing a probability of peeling-off relative to the loss of an oxygen component.
Figure 12:
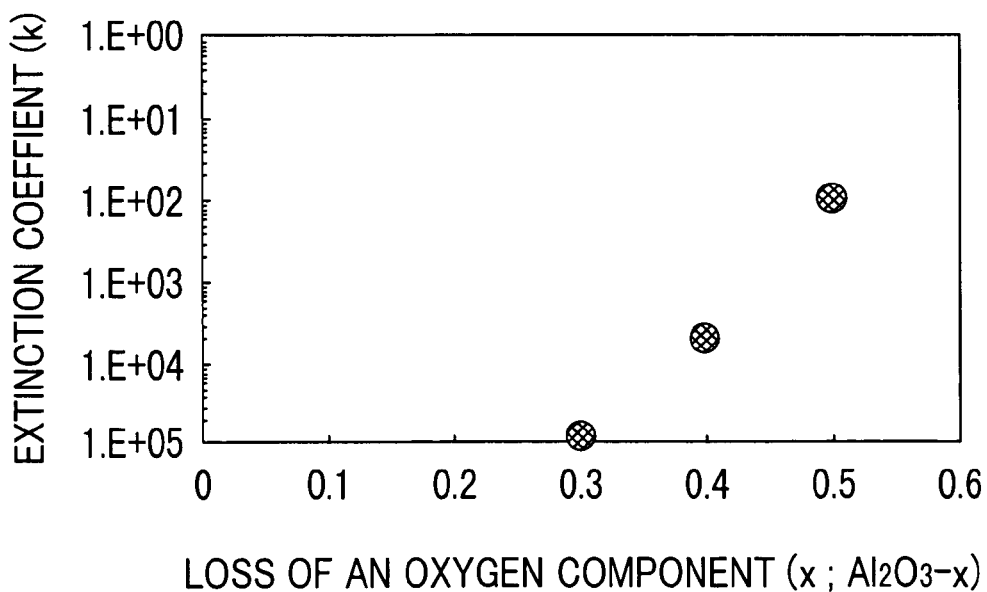
FIG. 12 is a view showing an extinction coefficient relative to the loss of an oxygen component.
Figure 13:
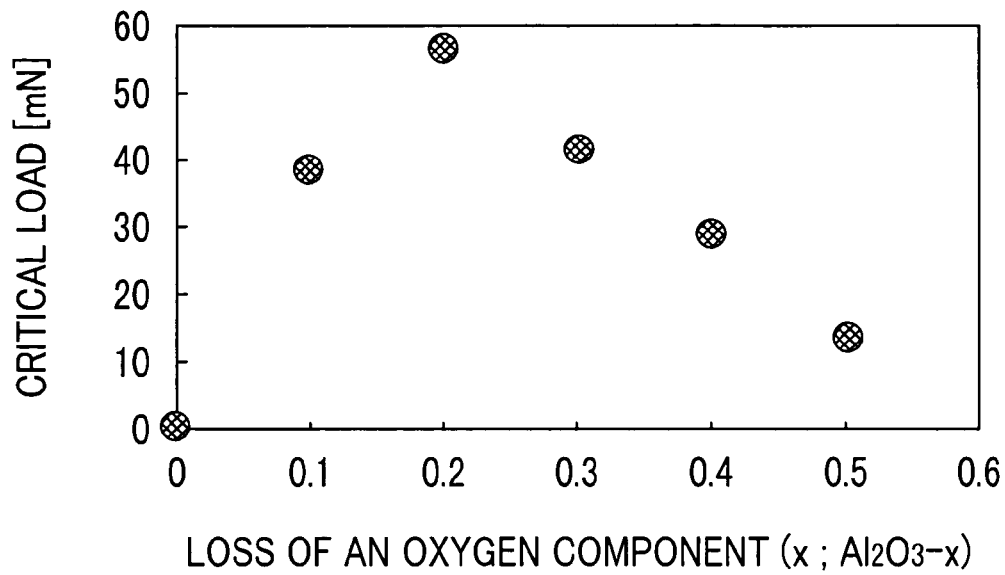
FIG. 13 is a view showing a critical load relative to the loss of an oxygen component.
Figure 14:
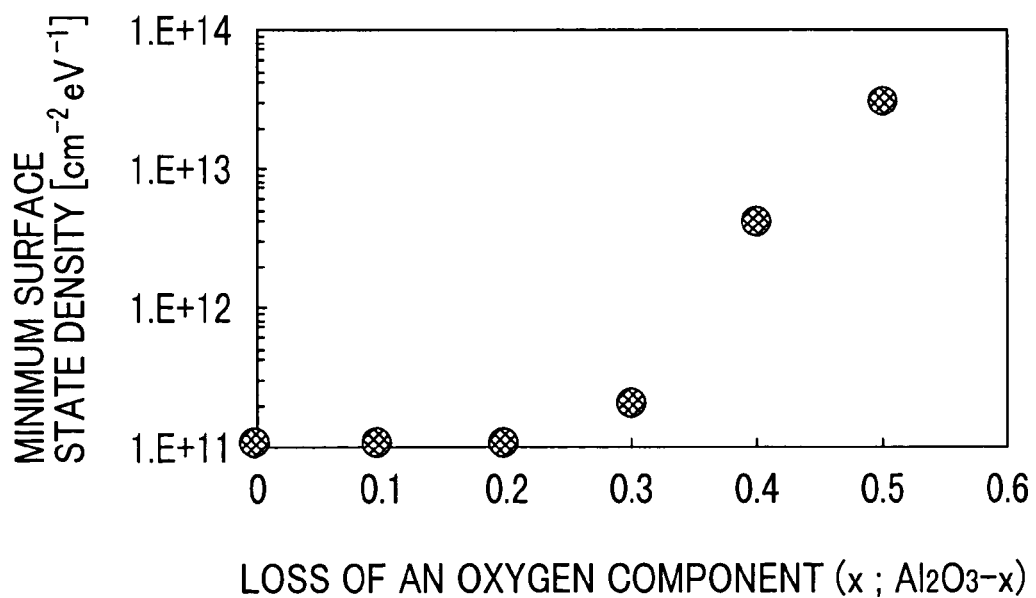
FIG. 14 is a graph showing a minimum surface state density relative to the loss of an oxygen component.
Figure 15:
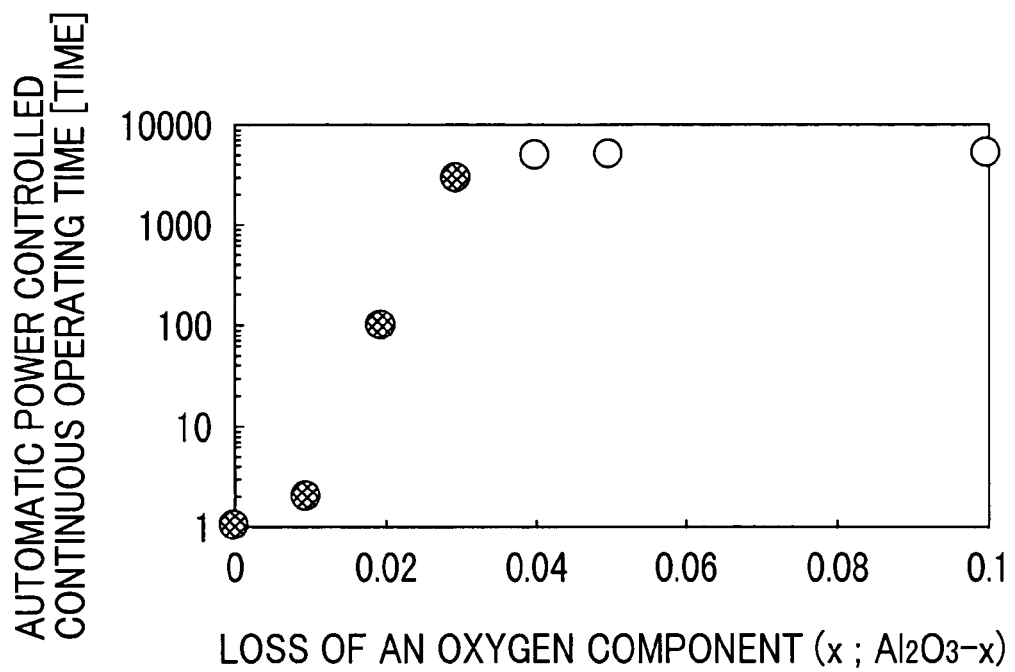
FIG. 15 is a graph showing an automatic power controlled continuous operating test time relative to the loss of an oxygen component.
Figure 16:
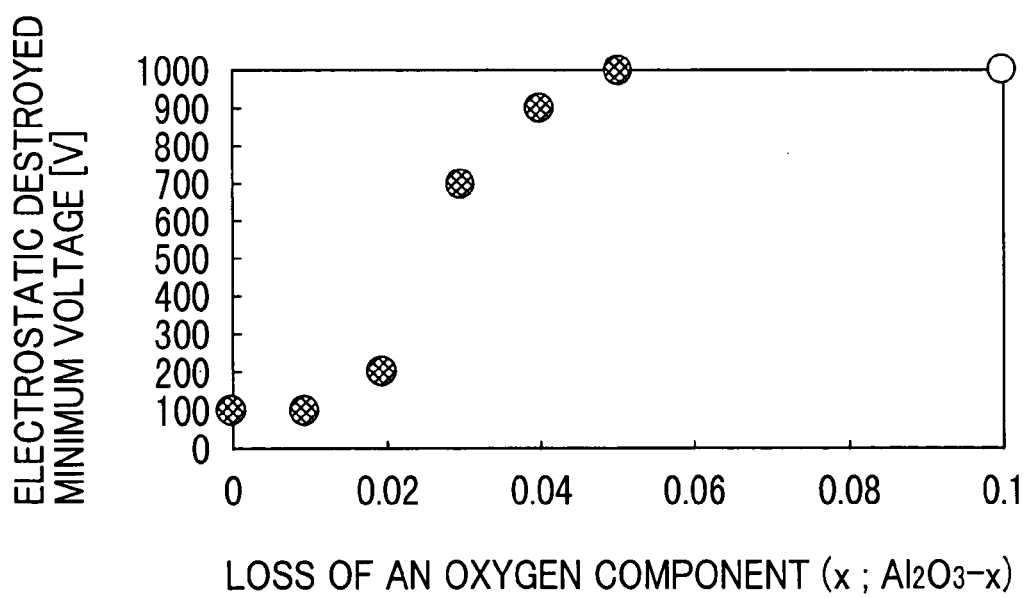
FIG. 16 is a graph showing an electrostatic destroyed minimum voltage relative to the loss of an oxygen component.
Figure 17:
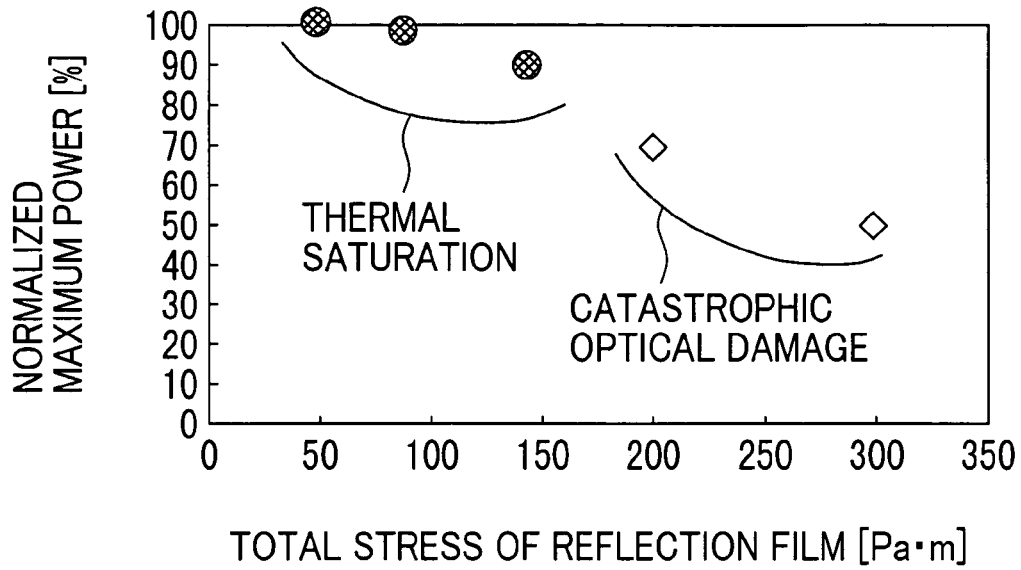
FIG. 17 is a graph showing a normalized maximum power relative to the total stress of the reflection film.
Figure 18:
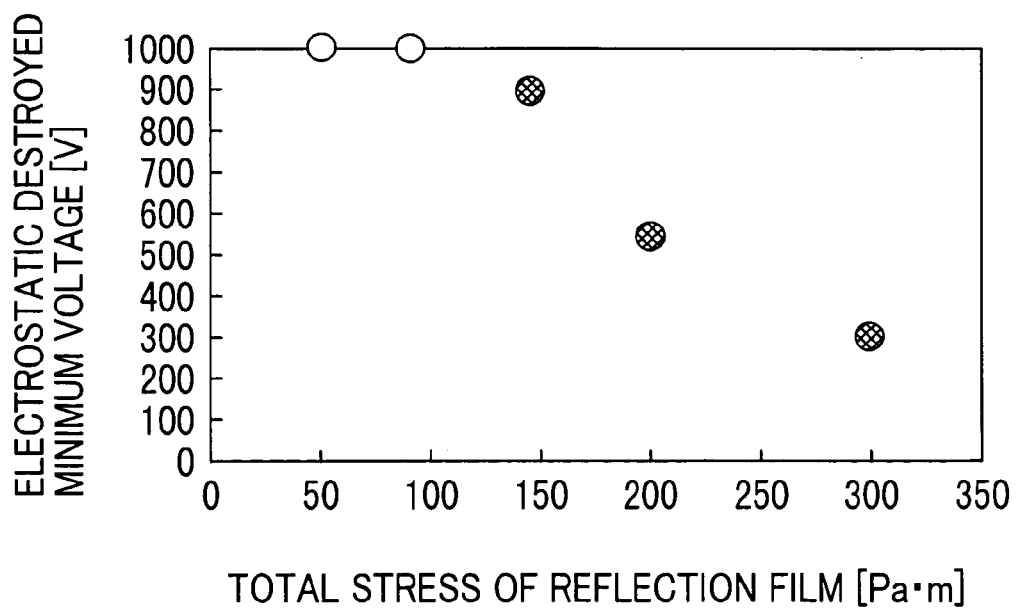
FIG. 18 is a graph showing an electrostatic destroyed minimum voltage relative to the total stress of the reflection film.

FIG. 10 is a perspective view for a module formed by mounting a semiconductor laser diode 1001 of Example 3 or 4 according to the invention over a heat sink 1002 and then integrating an optical lens 1003, a photodiode 1004 for monitoring backward facet optical power, an optical fiber 1005 and a laser operation driver IC 1006. The thus manufactured module attains a stable single mode operation with a sub-mode suppression ratio of 40 dB or more in a wide temperature range from −40 to 85° C. at a high manufacturing yield of 95% or more. Further, a distinct eye aperture with an extinction coefficient of 8 dB or more at an operation speed of 10 Gbit/s is obtained. Since the laser diode causes no deterioration even in a long time continuous operation, it is extremely effective to improve the reliability and the working life of the module and it is also extremely effective to the reduction of the total cost for the entire system.

According to the invention, since the long time reliability of the laser diode is improved, it is applicable to laser diodes for reading/writing light source for use in recording media such as CD, or DVD. Further, it is also usable to optical communication systems.

Description for references used in the drawings of the present application are as shown below.
101 edge facet of a resonator of a laser diode,
102 aluminum oxide film lacking in oxygen,
103 active layer,
104 reflection film of forward facet,
105 reflection film of backward facet
106, 107 optical thin film,
201 n-typed GaAs substrate,
202 n-typed GaAs buffer layer,
203 n-typed AlGaInP clad layer lattice matched to GaAs
204 AlGaInP barrier layer,
205 InGaP strained quantum well layer,
206 AlGaInP-SCH layer,
207 strained quantum well active layer,
208 p-typed AlGaInP clad layer,
209 p-typed InGaP etching stopping layer,
210 p-typed AlGaInP clad layer,
211 p-typed AlGaAs cap layer,
212 n-typed GaAs current blocking layer,
213 p-typed GaAs contact layer,
214 ohmic contact electrode on p-typed GaAs
215 ohmic contact electrode on n-typed GaAs
216 low reflection film
217 high reflection film
218 active layer
401 low reflection film
402 high reflection film
403 active layer
501 n-typed GaAs substrate,
502 n-typed GaAs buffer layer,
503 n-typed InGaP clad layer,
504 InGaAsP barrier layer,
505 InGaAs strained quantum well layer,
506 strained quantum well active layer,
507 p-typed InGaP clad layer lattice matched to GaAs substrate
508 p-typed GaAs optical waveguide layer,
509 p-typed InGaP clad layer lattice matched to GaAs
510 p-typed GaAs cap layer,
511 n-typed InGaP current blocking layer,
512 p-typed GaAs contact layer,
513 ohmic electrode for p-typed GaAs,
514 ohmic electrode for n-typed GaAs,
601 laser diode according to Example 3 of the invention,
701 n-typed InP substrate,
702 n-typed InP buffer layer,
703 n-typed InAlAs clad layer lattice matched to InP,
704 n-typed InGaAlAs lower SCH layer,
705 InGaAlAs strained quantum well active layer,
706 p-typed InGaAlAs upper SCH layer lattice matched to InP,
707 p-typed InAlAs first clad layer,
708 p-typed InP second clad layer,
709 p-typed InGaAs cap layer,
710 p-typed InGaAs contact layer,
711 ohmic electrode for p-typed InGaAs,
712 ohmic electrode for n-typed InP,
713 aluminum oxide film lacking in oxygen,
714 forward reflection film having 40% reflectivity,
715 backward reflection film having 75% reflectivity,
801, 901 p-typed InP substrate,
902 p-typed InP buffer layer,
903 p-typed InAlAs buffer layer lattice matched to InP,
904 InGaAlAs lower graded guide layer,
905 InGaAlAs multi-quantum well layer,
906 InGaAlAs middle guide layer,
907 InGaAlAsP graded composition layer,
908 InGaAsP middle guide layer,
909 InGaAsP multi-quantum well layer,
910 n-typed InP first clad layer,
911 diffraction grating,
912 non-doped InP second clad layer,
913 n-typed InGaAsP (compositional wavelength: 1.3 μm),
914 forward anti-reflection film having 0.1% reflectivity,
915 backward high reflection film having 70% reflectivity,
1001 laser diode,
1002 heat sink,
1003 optical lens
1004 photodiode for monitoring,
1005 optical fiber,
1006 IC driver for laser operation,
1007 body,
1008 fiber sleeve,
1009 high frequency connector

What is claim is:

1. A method of manufacturing a horizontal optical resonator type laser diode having an optical resonator horizontal with respect to a substrate surface comprising the steps of:
   providing a substrate of a semiconductor;
   forming an active layer inside the semiconductor;
   forming an optical resonator mirror on a facet of the semiconductor; and
   forming a first insulator film in contact with said facet of the semiconductor as the optical resonator mirror and forming a reflection film formed by depositing a second insulator film on the first insulator film;
   wherein the first insulator film comprises aluminum oxide lacking in oxygen and the composition of an aluminum oxide is $Al_2O_{3-x}$ where $0.03 \leq x \leq 0.3$.

2. A method of manufacturing a laser diode according to claim 1, further comprising the steps of:
   forming a facet protection film or a facet reflection film having an aluminum oxide film lacking oxygen as a first layer on said facet of the semiconductor forming the optical resonator mirror; and
   depositing the aluminum oxide film by a reactive sputtering method or an ion beam sputtering method of irradiating a metal aluminum target with plasma or ionic beams by using a gas mixture of an argon gas and an oxygen gas thereby causing film depositing reaction.

* * * * *